United States Patent [19]

Briese

[11] 4,450,377

[45] May 22, 1984

[54] INTEGRATED CIRCUIT WITH PIEZOELECTRIC RESONATOR MOUNTED ON BLOCKS COMPRISING CAPACITORS

[75] Inventor: Wolfgang Briese, Berlin, Fed. Rep. of Germany

[73] Assignee: International Standard Electric Corporation, New York, N.Y.

[21] Appl. No.: 306,558

[22] Filed: Sep. 28, 1981

[30] Foreign Application Priority Data

Oct. 10, 1980 [DE] Fed. Rep. of Germany ....... 3038261

[51] Int. Cl.³ .................... H01L 41/08; H01L 41/04
[52] U.S. Cl. .................................. 310/348; 310/319; 331/158
[58] Field of Search ............... 310/317, 319, 348, 353, 310/366

[56] References Cited

U.S. PATENT DOCUMENTS

| | | | |
|---|---|---|---|
| 3,488,530 | 1/1970 | Staudte | 310/348 |
| 4,005,321 | 1/1977 | Shibata et al. | 310/348 |
| 4,266,156 | 5/1981 | Kizaki | 310/344 |

FOREIGN PATENT DOCUMENTS

| | | | |
|---|---|---|---|
| 1916210 | 10/1970 | Fed. Rep. of Germany . | |
| 55-110415 | 8/1980 | Japan | 310/348 |
| 2038094 | 7/1980 | United Kingdom . | |

OTHER PUBLICATIONS

Katoh, H., "Capacitors in Microwave Integrated Circuits", Electronics and Communications in Japan, vol. 54-B, No. 3, pp. 39-46, (Mar. 1971).

*Primary Examiner*—Siegfried H. Grimm
*Assistant Examiner*—W. R. Paxman
*Attorney, Agent, or Firm*—John T. O'Halloran; Peter R. Ruzek; Mary C. Werner

[57] ABSTRACT

In an assembly of a piezoelectric crystal and an IC on a substrate, additional capacitors, such as load capacitors of a crystal oscillator, are designed as blocks for mounting the crystal on the substrate at its vibration nodes.

6 Claims, 3 Drawing Figures

INTEGRATED CIRCUIT WITH PIEZOELECTRIC RESONATOR MOUNTED ON BLOCKS COMPRISING CAPACITORS

BACKGROUND OF THE INVENTION

The present invention relates to an assembly with an electronic oscillator and/or amplifier and/or divider circuit on a substrate, and with one or more piezoelectric resonators and particularly crystal and piezoceramic resonators attached to the substrate by means of blocks on which the resonators rest at their vibration nodes. Such an assembly is the subject matter of the copending German Application No. P 30 38262 by the present invention.

FIG. 1 shows part of the oscillator circuit of a quartz-crystal-watch module. The other divider stages present on a chip used for such purposes, such as the IC 1115, are not shown. Because of the very low supply voltage of an integrated circuit, the necessary load capacitors $C_{L1}$ and $C_{L2}$ can be implemented as junction capacitances in such a circuit only with great difficulty and with lower Qs. Therefore, they had to be inserted into the module circuit as discrete components. Similarly, filter circuits with piezoelectric resonators require capacitances which had to be implemented with discrete components, too.

SUMMARY OF THE INVENTION

The present invention therefore has for its object to integrate these capacitances into the holders of the piezoelectric resonators used, thus eliminating the need for any new, special components, which would take up additional space. This object is attained by the means set forth in the claims.

BRIEF DESCRIPTION OF THE DRAWING

The invention will now be described by way of example with reference to the accompanying drawing, in which.

DESCRIPTION OF THE PREFERRED EMBODIMENT

Figure 1:
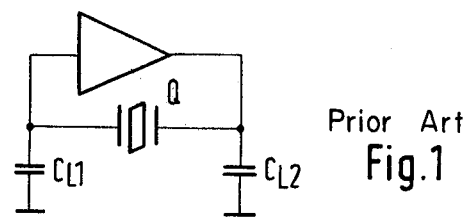
FIG. 1 is the oscillator diagram mentioned above.
Figure 2:
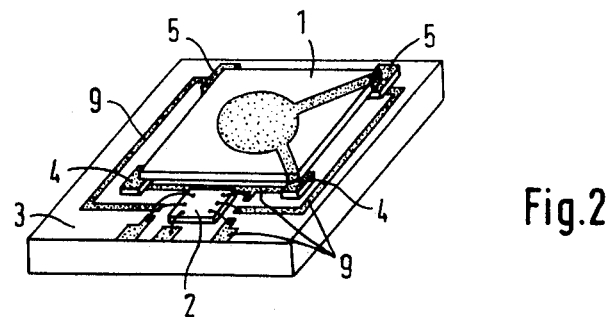
FIG. 2 shows an assembly according to the invention, with blocks designed as capacitors.

FIG. 2 shows a piezoelectric resonator 1, an integrated circuit 2, and a substrate 3, which supports the resonator and the circuit. The plate-shaped resonator 1 is mounted on the substrate 3 by means of blocks attached at vibration nodes of the resonator 1. The blocks 4 are designed as capacitors and connect the electrodes of the resonator 1 to ground via the capacitors of blocks 4 and the conductive strips 9. The blocks 5 are made of conductive material or of an insulating material with completely or partially metallized surface and connect the electrodes to the electronic circuit 2 via associated conductive strips 9. The substrate 3 may be a conventional printed circuit, i.e., a copper-clad insulating board, for example, on which the unwanted portions of the copper were etched away, but the conductive strips may also be deposited otherwise by any of the conventional processes. The substrate may also be a ceramic plate with conductive strips 9 or the film of a thin- or thick-film circuit.

It is obvious that the blocks 4 and 5 must separate the resonator 1 from the substrate 3 by such a distance that the air cushion between the resonator 1 and the substrate 3 causes no undesirable damping of the resonator 1. The electronic circuit 2 may be an integrated circuit, as indicated in FIG. 2, but it may also be built with discrete components or fabricated by depositing conductive or resistive films and mounting semiconductor devices thereon.

Figure 3:
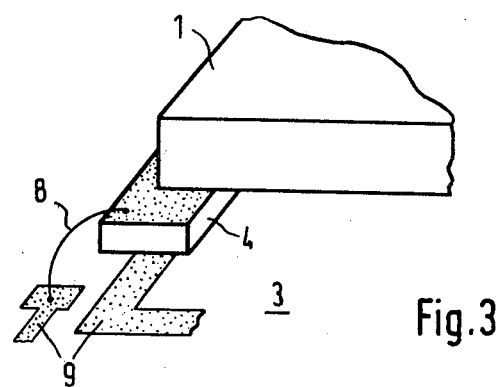
FIG. 3 shows the use of such a block for making direct and capacitive connection to a resonator electrode.

In the example of FIG. 2, blocks 5 are needed for direct connections between the resonator electrodes and the circuit 2, and blocks 4 are required for capacitive connections. FIG. 3 shows how both types of connection can be made by means of blocks 4 designed as capacitors. The same reference characters as in FIG. 2 are used to designate corresponding parts. Only one resonator corner with one block is shown for clarity. The direct connection from a conductive strip 9 to an electrode of the resonator is made by a lead 8 between the upper capacitor plate of the block 4 which is connected to the electrode of the resonator 1, and the associated conductive strip 9. The blocks 4 are connected to the associated resonator electrode and to the corresponding conductive strip by means of a conductive adhesive or by soldering.

I claim:

1. An assembly comprising:
a substrate;
an electronic circuit positioned on said substrate;
a piezoelectric resonator; and
a plurality of blocks joining said piezoelectric resonator with said substrate at the vibration nodes of said resonator and spacing the resonator and the substrate a predetermined distance apart, at least one of said blocks being constructed as a capacitor.

2. The assembly as claimed in claim 1 wherein said at least one of said blocks has a first capacitor plate facing said substrate and a second capacitor plate facing said resonator and serves as a load capacitor for said electronic circuit.

3. The assembly as claimed in claim 2 wherein said electronic circuit further includes conductive strips on said substrate, one of said strips having a portion joined to said first capacitor plate.

4. The assembly as claimed in claim 3 wherein said resonator has at least one electrode and further comprising means for electrically connecting said second capacitor plate to said at least one electrode.

5. The assembly as claimed in claim 4 wherein at least a different one of said blocks is constructed as a conductor and is electrically connected to said at least one electrode of said resonator and to one of said conductive strips to provide electrical connection therebetween.

6. The assembly as claimed in claim 4 comprising a lead connected to said second capacitor plate of said at least one of said blocks for establishing direct electrical connection between said at least one electrode and one of said conductive strips.

* * * * *